United States Patent
Abali et al.

(10) Patent No.: US 11,223,369 B2
(45) Date of Patent: Jan. 11, 2022

(54) AUTOMATIC HASH FUNCTION SELECTION

(71) Applicant: International Business Machines Corporation, Armonk, NY (US)

(72) Inventors: Bulent Abali, Tenafly, NJ (US); Ashutosh Misra, Bangalore (IN); Girish G. Kurup, Bangalore (IN); Deepankar Bhattacharjee, Bangalore (IN); Matthias Klein, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 506 days.

(21) Appl. No.: 16/373,375

(22) Filed: Apr. 2, 2019

(65) Prior Publication Data

US 2020/0321976 A1 Oct. 8, 2020

(51) Int. Cl.
*H03M 7/40* (2006.01)
*H03M 7/42* (2006.01)
(Continued)

(52) U.S. Cl.
CPC .......... *H03M 7/42* (2013.01); *G06F 16/2255* (2019.01); *H03M 7/40* (2013.01); *H03M 7/3084* (2013.01)

(58) Field of Classification Search
CPC ........ H03M 7/3084; H03M 7/40; H03M 7/30; H03M 7/3086; H03M 7/3091; H03M 7/4056; H03M 7/42; H03M 7/4037; H03M 7/4062; H03M 7/6017; H03M 7/6041; H03M 7/3088; H03M 7/6058; H03M 7/4031; G06F 40/284; G06F 16/9014; G06F 16/90344; G06F 21/79; G06F 3/065; G06F 2212/401; G06F 16/1744; H04L 9/0643
(Continued)

(56) References Cited

U.S. PATENT DOCUMENTS 5,406,279 A * 4/1995 Anderson ........... H03M 7/3086
341/51
6,700,809 B1 * 3/2004 Ng ........................ G11C 15/00
365/236

(Continued)

FOREIGN PATENT DOCUMENTS

WO 20170223114 A1 12/2017
WO 2018130802 A1 7/2018

OTHER PUBLICATIONS

Pekhimenko et al., Exploiting Compressed Block Size as an Indicator of Future Reuse, SAFARI Technical Report No. #2013-003 (Dec. 21, 2013), 13 pages.

(Continued)

*Primary Examiner* — Linh V Nguyen
(74) *Attorney, Agent, or Firm* — Patterson + Sheridan, LLP (57) ABSTRACT

Compressing data includes hashing a first token length of an incoming data steam into a hash table, where the first token length includes a plurality of bytes. A second token length of the incoming data stream may be hashed into the hash table. The second token may be larger than the first token length and includes the plurality of bytes. The method may further include automatically comparing which token length enabled more efficient data compression, and automatically adjusting at least one of the first and second token lengths based on the comparison.

20 Claims, 4 Drawing Sheets

(51) Int. Cl.
*G06F 16/22* (2019.01)
*H03M 7/30* (2006.01)

(58) Field of Classification Search
USPC .................. 341/67, 63, 65, 106, 107, 95
See application file for complete search history.

(56) References Cited

U.S. PATENT DOCUMENTS

| | | | |
|---|---|---|---|
| 6,934,796 B1* | 8/2005 | Pereira .................. | G11C 15/00 |
| | | | 365/49.17 |
| 9,647,682 B1* | 5/2017 | Heng .................. | H03M 7/3088 |
| 9,768,802 B2 | 9/2017 | Gopal et al. | |
| 9,768,803 B2 | 9/2017 | Henry et al. | |
| 2004/0148487 A1* | 7/2004 | Mori .................. | G06F 16/9014 |
| | | | 711/216 |
| 2014/0281351 A1 | 9/2014 | Topp et al. | |
| 2014/0379671 A1* | 12/2014 | Barrus ................ | G06F 16/2365 |
| | | | 707/692 |
| 2015/0205716 A1* | 7/2015 | Moon ....................... | G06F 3/06 |
| | | | 711/159 |
| 2017/0111058 A1 | 4/2017 | Fallon | |
| 2017/0192708 A1* | 7/2017 | Abali .................. | H03M 7/6076 |
| 2018/0189062 A1 | 7/2018 | Baghsorkhi et al. | |
| 2020/0162100 A1* | 5/2020 | Beckman ............ | G06F 13/1673 |

OTHER PUBLICATIONS

Qureshi, et al., "Adaptive Insertion Policies for High Performance Caching", ISCA '07 Proceedings of the 34th annual International symposium on Computer architecture, pp. 381-391, 2007. [Abstract Only].

* cited by examiner

AUTOMATIC HASH FUNCTION SELECTION

BACKGROUND

This disclosure relates generally to data compression and, more particularly, to hash table based string matching for data compression.

Conventional hardware can perform data compression by replacing repeated data strings in an input data buffer with pointers. The pointers designate prior positions of the repeated strings in the input data buffer. The pointers are typically smaller than the repeated data strings, thus achieving data compression.

Some data compressors use hash based matching to find the repeated data strings in an input data buffer. More particularly, a hash table is constructed with each entry corresponding to a respective data substring that was found previously in the input data buffer. The hash table can facilitate locating historical strings. Leading bytes of each historical string, called a token, may be hashed, for instance, to an eleven bit hash table location. As a reminder of the historical string location, an address offset of the string in an input stream may be stored in the hash table. The hash table may also include the token or a distilled version of the token, thus saving memory bits.

The token length is manually set at a fixed number of bytes based on performance expectations. For instance, a user may set the token length at five bytes. Setting the fixed token length to be longer can identify longer strings to compress. However, the longer token size may fail to encode shorter strings. Setting the fixed token length to a short number may identify more strings to encode but can fail to identify which string is the longest among those identified. Additionally, since many tokens map to the same hash table location with a limited number of entries, the historical strings cannot be retained for as long.

SUMMARY

According to one embodiment of the present invention, a system includes a hash table configured to receive a first token length of an incoming data steam, where the first token length includes a plurality of bytes, and to receive a second token length of the incoming data stream. The second token may be larger than the first token length and include the plurality of bytes. A comparison module may automatically compare which token length enabled more efficient data compression. A hash adjustment module may automatically adjust at least one of the first and second token lengths based on the comparison.

According to a particular implementation, A method of compressing data may include receiving dueling test token lengths from an input data stream and receiving a current token length from the input data stream. The method may further include concurrently hashing the dueling token lengths and the current token length, and automatically adjusting the current token length based on the dueling token lengths.

A method of compressing data includes hashing a first token length of an incoming data steam into a hash table, where the first token length includes a plurality of bytes. A second token length of the incoming data stream may be hashed into the hash table. The second token may be larger than the first token length and includes the plurality of bytes. The method may further include automatically comparing which token length enabled more efficient data compression, and automatically adjusting at least one of the first and second token lengths based on the comparison.

DETAILED DESCRIPTION

An embodiment of a hardware compression system may automatically and dynamically select a token size in real-time. Selecting the token size may impact the compression ratio by selecting token sizes long enough to identify longer stings, while avoiding missing and failing to encode shorter strings that would have been useful if a long string had not been found. A shorter token size may be selected to identify more strings to encode, while still identifying which of the identified strings is the longer one.

An embodiment of the system selects a token byte length to get the most compression possible. The system may recognize that some token lengths yield better compression ratio for given benchmark data streams than other token lengths. An embodiment of a system includes an automatic token length selector module, or hash adjuster, and associated processes. For instance, the system may choose whether to use five or six byte tokens for a given data stream. Therefore, an improved data compression method is implemented using an automatic token length selection.

A particular implementation combines the token length selection module, a hash table, and set-dueling processes to measure and choose different token lengths in real-time. The system may monitor the data stream and automatically chooses the best one of the token lengths (e.g., three, four, five, six, seven, or eight bytes). In contrast to systems that used fixed hash token sizes, the system may select two or more dueling hash token sizes to determine and choose the best compression ratio advantage. The system may further monitor and ratchet the selected setting over an entire duration of an input stream.

A method of an embodiment integrates translation prefetch instructions to Instruction Set Architecture (ISA) to facilitate fetching of an address translation (e.g., table walk) without holding up the rest of a pipeline. The translation software prefetching instructions may utilize a partial work of prefetching data caches and loads translations into translation look aside buffer (TLB). As such, separate instructions may be loaded into the translation into both the TLB, as well as a higher-level translation cache. In the higher-level translation cache, the instructions may pass through the processor until a miss queue. In response to the miss queue, the instructions may take an entry and begin the process of loading the translation.

Because token lengths influence the compression ratio, an embodiment of the system automatically selects a token size (e.g., three, four, five, six, seven, or eight bytes) during run time, so is adaptive to the entropy/correlation of input data in real-time. That is, the automatic hash function selection may be performed dynamically, on the fly, and without pre-screening data.

Data compression accelerator hardware of an embodiment uses a hash table for fast location of historical strings. Leading bytes of each string, comprising a token, may be hashed to an eleven bit hash table location. As a reminder of the string location, an address, or offset, of the string in the input stream may be stored in the hash table. A token, or a distilled version of the token (for saving memory bits), may additionally be stored in the hash table.

An implementation of the system automatically selects the token length. For instance, the system may determine whether five or six token byte lengths will be more efficient and effective. The most efficient token length of one processor may be five bytes. However, other token lengths yield better compression ratios for some benchmark data streams under other conditions and environments. Therefore, an improved data compression method may include using an automatic token length selection.

A particular implementation combines a token length selection module, a hash table, and set-dueling processes to measure and choose different token lengths in real-time. The system may monitor the data stream and automatically chooses the best one of the token lengths (e.g., three, four, five, six, seven, or eight bytes).

Figure 1:
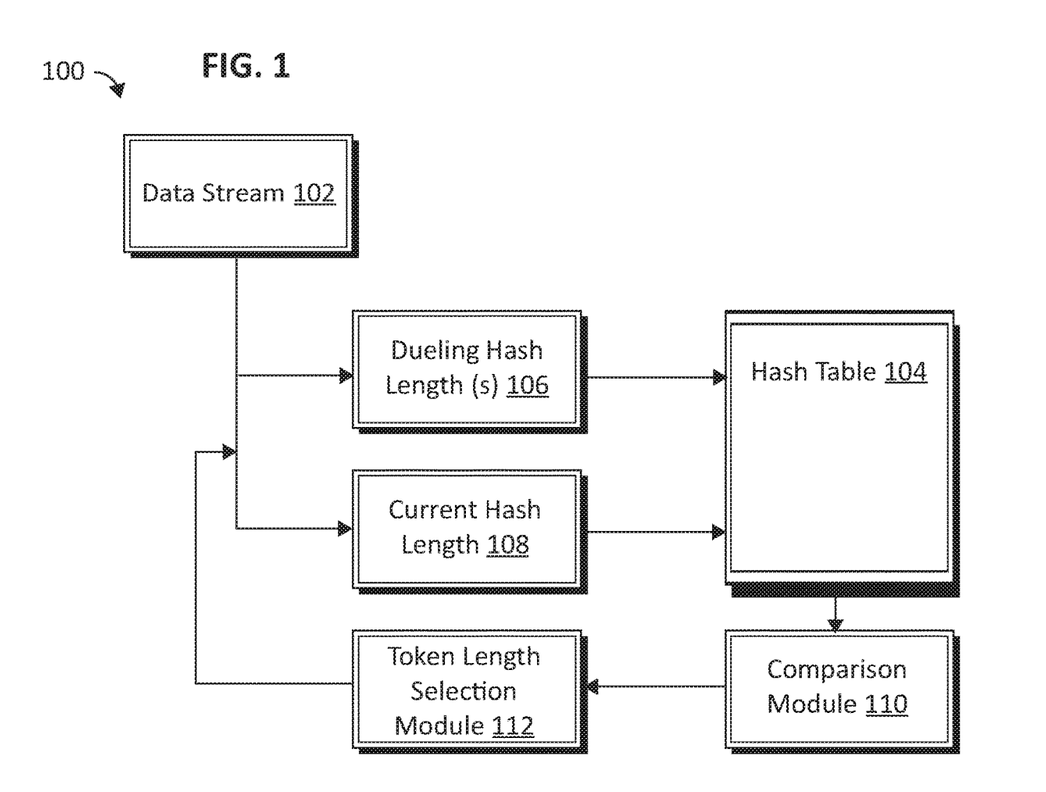
FIG. 1 is a block diagram of an embodiment of a system that includes a token length selection module, a hash table, and set-dueling processes to measure and choose different token lengths in real-time.

With reference now to FIG. 1, a system 100 may include a token length selection module 102, a hash table 104, and set-dueling processes to measure and choose different token lengths in real-time. In one implementation, the system 100 may comprise a processor.

The system 100 may monitor the data stream and automatically choose the best one of the token lengths (e.g., three, four, five, six, seven, or eight bytes). In contrast to systems that used fixed hash token sizes, the system may select two or more dueling hash token sizes to determine and choose the best compression ratio advantage. The system 100 may further monitor and ratchet the selected setting over an entire duration of an input stream.

The token length selection module 102 may automatically select the token length. For instance, the token length selection module 102 may determine whether five or six token byte lengths will be more efficient and effective. The most efficient token length of one processor may be five bytes. However, other token lengths yield better compression ratios for some benchmark data streams under other conditions and environments. Therefore, an improved data compression method may include using an automatic token length selection.

The system 100 may use dueling hash techniques to generate competing one or more hash lengths 106. The hash length 106 may have a different length than the current token length and than each other. The system 100 may additionally generate a current hash length 108 using the current token length setting.

The hash length 106 and dueling lengths 108 may be supplied to the hash table 104. The hash table 104 and the hash length 106 may be utilized for tag comparisons for the incoming data stream 112.

The hash length 106 and dueling lengths 108 may be used by a comparison module to determine a most efficient token length. Based on the comparison, the token selection module 102 may select the most desirable token length for use as the updated or same current hash length 108. The dueling hash lengths 108 may also be adjusted based on the comparison.

Figure 2:
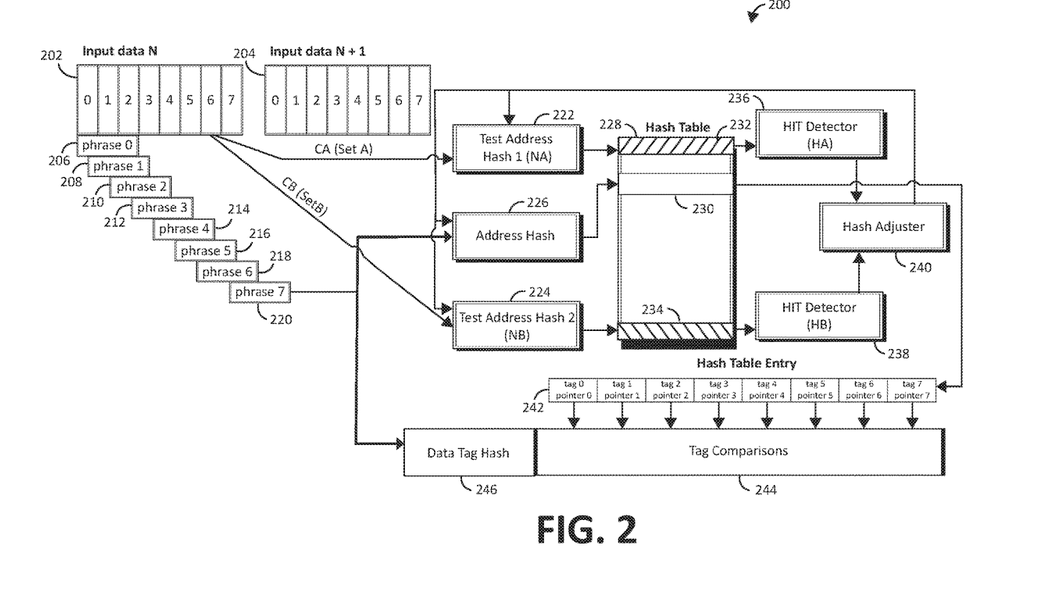
FIG. 2 is a block diagram of another embodiment of system configured to continuously determine and implement a most efficient token byte hash length for data compression.

FIG. 2 is a block diagram of another embodiment of system 200 configured to continuously determine and implement a most efficient token byte hash length for data compression. The system may be implemented in hardware, such as on a microchip, and includes a hash table 228 having multiple indexes 230, 232, 234. An input data stream 202, 204 may be hashed by a first test address hash module 222 and a second test address hash module 224. The test address hash modules 222, 224 may each use a different token size on the same incoming data stream 202, 204. Outputs from the test address hash modules 222, 224 may be provided to indexes 232, 234, respectively, of the hash table 228. Phrases 206, 208, 210, 212, 214, 216, 218, 220 represent data being provided to the test address hash modules 222, 224, as well as an address hash module 226. The hash modules 226 may operate concurrently and in real-time.

The address hash 226 may use a current token size in a hashing operation to complete active compression operations that are currently being used by the system 100. To this end, the output of the address hash 226 may be provided to the index 230 of the hash table 228. From the hash table 228, the output may be sent as hash table entries 242 to a tag comparison module 244. The tag comparison module 244 may access a data tag hash 246.

The system 200 additionally includes a hash adjuster module 240 that receives inputs from hit detectors 236, 238. The hash adjuster module 240 may be configured to adjust the sizes of one or more of the current and test hash token lengths.

Test address module 222 may have a token length NA that includes a first set of data (e.g., set A). Test address module 224 may have a token length NB that includes a second set of data (e.g., set B). In a particular example, NA equals five bytes, and NB equals six bytes. Put another way, NA may use a five byte tag hash function, and NB may use a six byte tag hash function. In the example, both NA and NB may use the same set hash three bit output hash function.

The two hit detector modules 236, 238 may have two hit counters, HA and HB, respectively. When a token is found in the set A, HA may be incremented by some amount. When a token is found in the set B, HB may be incremented by the same amount.

When a hit occurs, the string may be encoded by a compression encoder known in the art, such as Lempel-Ziv encoding. For example, a string located in the historical input (that is NA or NB bytes long or longer) may be replaced by an encoded value. Continuing with the above an example, an encoded value is typically E bytes long, where E is generally smaller than three bytes. For instance, E is typically two bytes long. As such, a five or six long byte token (e.g., comprising NA) may be replaced by a smaller, two or three byte long encoded value. Thus, the compression benefit of sets A and B may be quantified and represented as CA and CB, respectively.

The system may estimate which set (i.e., set A or set B) encodes more data (i.e. CA bytes or CB bytes). The system may then choose the most effective token length for the remaining sets in the hash table. In a particular example, E equals two. As such, CA=HA*(5-3)=HA*2, and CB=HB*(6-3)=HB*3.

If CA>CB, the system may determine that the NA size token is more beneficial. Conversely, if CA<CB, the system may determine that the NB size token is more beneficial. Thus the more beneficial token length may be used for the remaining sets, or until updated, again.

In one embodiment, the bytes of tokens common to both NA and NB length tokens are hashed by the system to a three bit value (set_hash). Common bytes may be the first K bytes of each token, where K<NA and K<NB. If set_hash=000, then the system 200 may consider set_hash to be a part of set A. Alternatively, if set_hash=111, then the system may consider set_hash to be a part of set B. In the above example, the initial selection of three bit patterns and the choice of a set_hash hashing function are arbitrary and for illustrative purposes.

In a particular example, set A and set B each contain $2^{(11-3)}=256$ table locations out of $2^{11}=2048$ total table locations. Put another way, set A and set B each contain 12.5% of the hash table locations. The system 200 may use set dueling processes to allow the two sets, set A and set B, to be processed using different token lengths. The system 200 may use the winning token length for the remaining sets (e.g., sets that are neither in set A nor set B) to realize the advantages of the winner of the duel across the span of the entire data sets (e.g., set A and set B).

In one implementation, the system 200 may use set dueling processes to duel different token lengths. Continuing with the above example, the system 200 may use five byte token length for set A and may use a six byte token length for set B. As such, 12.5% of the hash table locations may use five byte token lengths, and another 12.5% may use six byte token lengths. The system 200 may then measure the efficacy of using set A and set B. Once a winner is determined by the system, the winning token length may be used for the rest of the data sets (e.g., the remaining 75%).

Other embodiments may use more than two dueling sets. For example, a system of another embodiment may identify dueling sets using the three bit constants. For instance, the system may use 000 for NA equals five, 001 for NB equals six, and 010 for NB equals seven. Overflows that might otherwise occur in the hit counters. HA and HB, due to ever increasing hits may be avoided by periodically dividing the counter values by two.

According to another embodiment of the system 200, only two measuring sets may be present, although more than two token sizes may be selected. For example, set A and set B may be initially associated with five bytes and six bytes token sizes, respectively. For purposes of the example, N may be five bytes token size and N plus one may be the six byte token size.

The system 200 may determine which set achieves more advantageous compression. Where the system determines that set A had the best results, the token size of N may be automatically selected. The system may then decrement N by one, thus making new token sizes to monitor. Continuing with the above example, the new byte token sizes would be four and five bytes, respectively, for set A and set B.

Should the system 200 alternatively determine that set B had the best data result, the system 200 may increment N by one. As such, the new token sizes may be six and seven bytes, respectively, for set A and set B.

The above two steps may be continuously performed as the data is streaming in for a range of N values, where N equals, for example, three, four, five, six, and seven. At certain intervals, the system may determine the winning set, and the N value is changed, accordingly. Ratcheting the value of N up and down in this manner results in the hash width selection logic automatically migrating towards a better size depending on the incoming data streaming.

Figure 3:
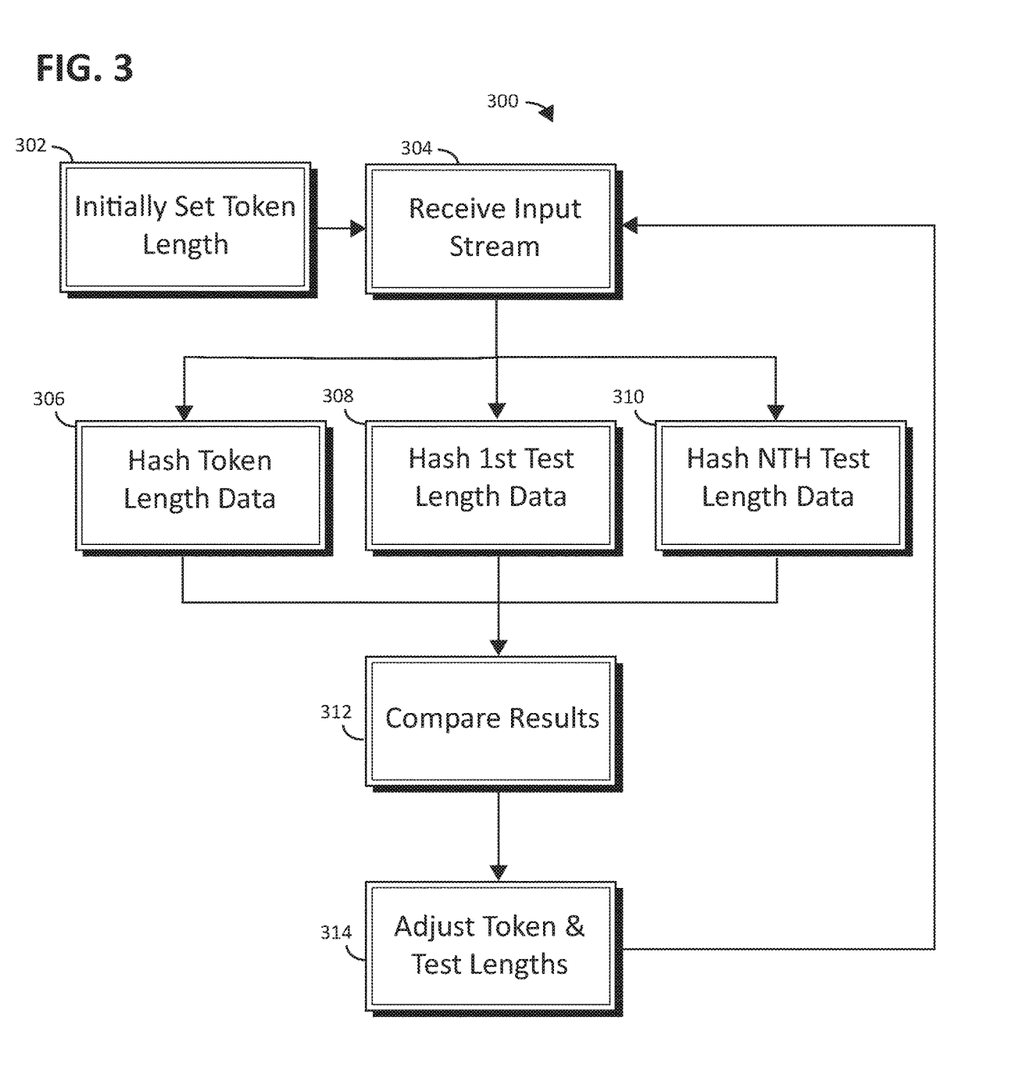
FIG. 3 is a flowchart of an embodiment of a method of compressing data that includes hashing and comparing the efficiencies of different token lengths towards automatically selecting and updating a most beneficial token length size.

FIG. 3 is a flowchart of an embodiment of a method 300 of compressing data that includes hashing and comparing the efficiencies of different token lengths towards automatically selecting and updating a most beneficial token length size. The embodiment of the method 300 may be performed by a system such as that shown in FIG. 1 or 2.

At 302, a token length may be initially set, such as manually by a designer. For example, the token length may be initially set at five bytes. A data input stream may be received at 304.

At 306, the method 300 may include sampling the input stream using the current token length. The data may be processed using data tag comparisons and data tag hashes as discussed herein. Concurrently, hash data test lengths (e.g., $1^{st}$ though $N^{th}$ length data) may be sampled and processed using a hash table at 308 and 310. An embodiment may compare the results of the test data at 312, and adjust the token and test lengths at 314.

Figure 4:
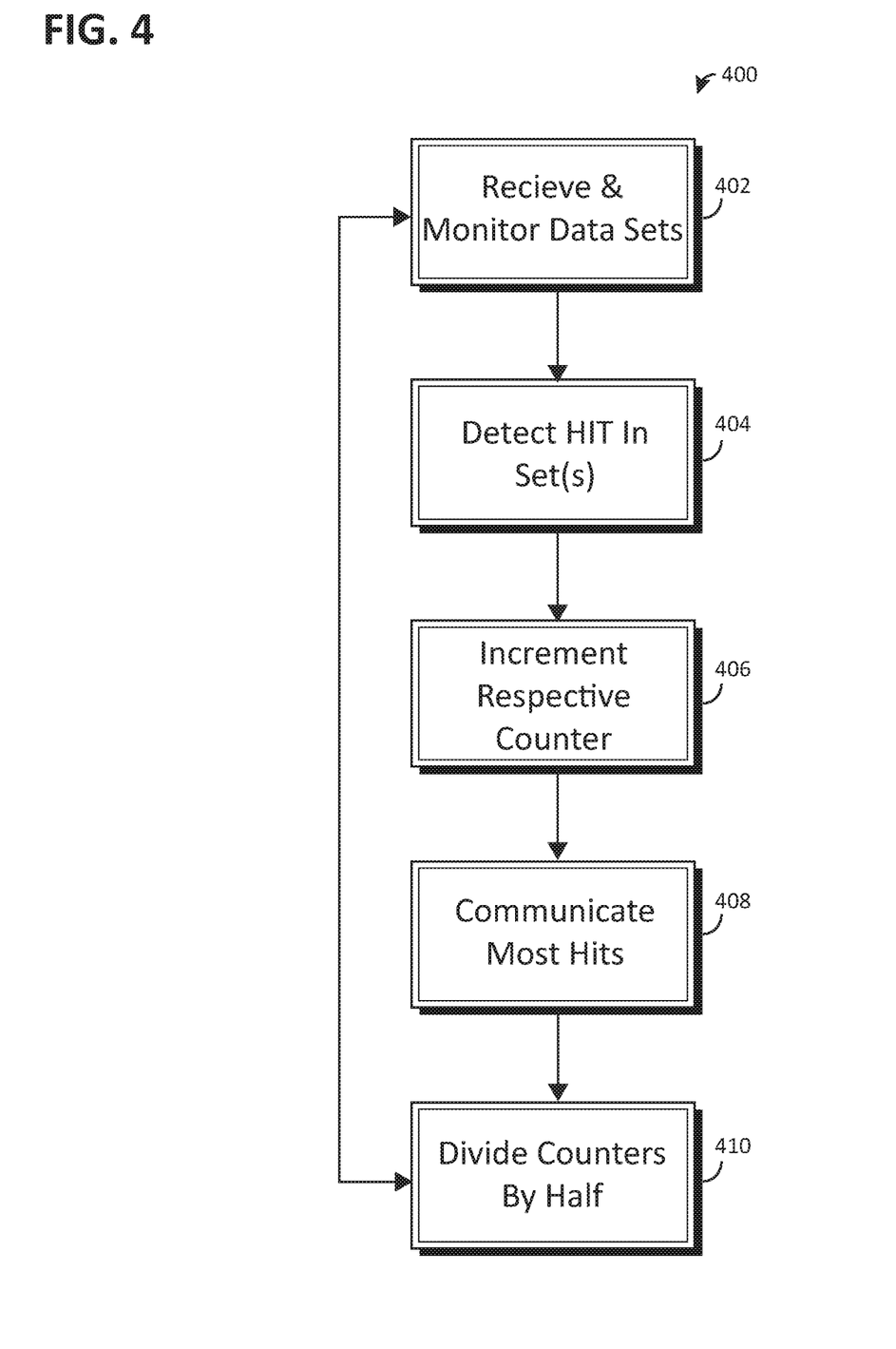
FIG. 4 is a flowchart of an embodiment of a method determining a most beneficial token length size as between dueling sets of compressed data.

FIG. 4 is a flowchart of an embodiment of a method 400 determining a most beneficial token length size as between dueling sets of compressed data. The embodiment of the method 400 may be performed by a system such as that shown in FIG. 1 or 2.

At 402, an embodiment of a system may receive and monitor data sets. For instance, the system may receive actual and test hash tag lengths.

The system may detect in multiple sets at 404. Based on the hits, the system may increment a counter at 406. The system may use the counters to determine and communicate the most hits at 408. Where the counts become too high in the counters, the system may reduce the amounts by, for instance, dividing the counts by two or some other value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method of compressing data, the method comprising:
    hashing a first token length of an incoming data steam into a hash table, wherein the first token length includes a plurality of bytes;
    hashing a second token length of the incoming data stream into the hash table, wherein the second token is larger than the first token length and includes the plurality of bytes;
    automatically comparing which token length enabled more efficient data compression; and
    automatically adjusting at least one of the first and second token lengths based on the comparison.

2. The method of claim 1, wherein hashing the first and second token lengths further comprises hashing the first and second token lengths concurrently.

3. The method of claim 1, wherein the comparing is based on at least one of a number of successful compressions, misses, an ability to identify a longest string, and data retention.

4. The method of claim 1, wherein the comparing is based on a number of counter hits.

5. The method of claim 1, further comprising performing the comparing and the adjusting using hardware and firmware.

6. The method of claim 1, wherein hashing the first and second token lengths further comprises hashing a third token length, wherein the first, second, and third token lengths are hashed in real-time.

7. The method of claim 1, further comprising storing a distilled version of the first token length in the hash table.

8. The method of claim 1, wherein the comparing further comprises using dueling hash techniques.

9. The method of claim 1, wherein the adjusting occurs without prescreening the incoming data steam.

10. The method of claim 1, further comprising using an adjusted token length for remaining sets in the hash table.

11. A method of compressing data, the method comprising:
    receiving dueling test token lengths from an input data stream;
    receiving a current token length from the input data stream;
    concurrently hashing the dueling token lengths and the current token length; and
    automatically adjusting the current token length based on the dueling token lengths.

12. The method of claim 11, wherein adjusting the current token length further comprises ratcheting the current token length during a duration of the input data stream.

13. A system, comprising:
    a hash table configured to:
        receive a first token length of an incoming data steam, wherein the first token length includes a plurality of bytes; and
        receive a second token length of the incoming data stream, wherein the second token is larger than the first token length and includes the plurality of bytes;
    a comparison module automatically comparing which token length enabled more efficient data compression; and
    a hash adjustment module to automatically adjusting at least one of the first and second token lengths based on the comparison.

14. The system of claim 13, further comprising a hit counter configured to be using in the comparison.

15. The system of claim 13, wherein the comparing is based on at least one of a number of successful compressions, misses, an ability to identify a longest string, and data retention.

16. The system of claim 13, wherein the adjusting occurs without prescreening the incoming data steam.

17. The system of claim 13, wherein the hash table is used to hash a third token length, wherein the first, second, and third token lengths are hashed in real-time.

18. The system of claim 13, wherein a distilled version of the first token length is stored in the hash table.

19. The system of claim 13, wherein the comparing is based on at least one of a number of successful compressions, misses, an ability to identify a longest string, and data retention.

20. The system of claim 12, wherein remaining sets of the hash table us an adjusted token length based on the comparison.

* * * * *